(12) United States Patent
Lee et al.

(10) Patent No.: US 11,222,953 B2
(45) Date of Patent: *Jan. 11, 2022

(54) OPTICAL SENSOR AND IMAGE SENSOR INCLUDING GRAPHENE QUANTUM DOTS

(71) Applicant: Samsung Electronics Co., Ltd., Suwon-si (KR)

(72) Inventors: Jaeho Lee, Seoul (KR); Hyeonjin Shin, Suwon-si (KR); Dongwook Lee, Suwon-si (KR); Seongjun Park, Seoul (KR); Kiyoung Lee, Seoul (KR); Eunkyu Lee, Yongin-si (KR); Sanghyun Jo, Seoul (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/662,872

(22) Filed: Oct. 24, 2019

(65) Prior Publication Data

US 2020/0058741 A1 Feb. 20, 2020

Related U.S. Application Data

(63) Continuation of application No. 15/825,344, filed on Nov. 29, 2017, now Pat. No. 10,553,684.

(30) Foreign Application Priority Data

Jan. 10, 2017 (KR) .................. 10-2017-0003399
Mar. 21, 2017 (KR) .................. 10-2017-0035505

(51) Int. Cl.
*H01L 31/0352* (2006.01)
*H01L 29/16* (2006.01)
(Continued)

(52) U.S. Cl.
CPC ...... *H01L 29/1606* (2013.01); *H01L 27/1443* (2013.01); *H01L 27/14609* (2013.01); (Continued)

(58) Field of Classification Search
CPC ............... H01L 29/1606; H01L 29/122; H01L 31/035218; H01L 31/035236
See application file for complete search history.

(56) References Cited

U.S. PATENT DOCUMENTS 9,349,970 B2  5/2016  Klem et al.
10,553,684 B2 * 2/2020  Lee .................. H01L 31/101
(Continued)

FOREIGN PATENT DOCUMENTS

EP      2999010 A1    3/2016
JP    2002-299643 A   10/2002
(Continued)

OTHER PUBLICATIONS

Kim et al. "High-performance graphene-quantum-dot photodetectors", Scientific Reports | 4 : 5603 | DOI: 10.1038/srep05603.
(Continued)

*Primary Examiner* — Douglas M Menz
(74) *Attorney, Agent, or Firm* — Harness, Dickey & Pierce, P.L.C.

(57) ABSTRACT

Provided are an optical sensor including graphene quantum dots and an image sensor including an optical sensing layer. The optical sensor may include a graphene quantum dot layer that includes a plurality of first graphene quantum dots bonded to a first functional group and a plurality of second graphene quantum dots bonded to a second functional group that is different from the first functional group. An absorption wavelength band of the optical sensor may be adjusted
(Continued)

based on types of functional groups bonded to the respective graphene quantum dots and/or sizes of the graphene quantum dots.

19 Claims, 10 Drawing Sheets

(51) Int. Cl.
  H01L 31/09    (2006.01)
  H01L 31/028   (2006.01)
  H01L 31/101   (2006.01)
  H01L 51/05    (2006.01)
  H01L 51/00    (2006.01)
  H01L 27/144   (2006.01)
  H01L 27/146   (2006.01)
  H01L 27/15    (2006.01)
  H01L 29/12    (2006.01)
  H01L 27/30    (2006.01)

(52) U.S. Cl.
  CPC .......... *H01L 27/156* (2013.01); *H01L 29/122* (2013.01); *H01L 31/028* (2013.01); *H01L 31/035218* (2013.01); *H01L 31/035236* (2013.01); *H01L 31/09* (2013.01); *H01L 31/101* (2013.01); *H01L 51/0045* (2013.01); *H01L 51/0579* (2013.01); *H01L 27/307* (2013.01); *Y02E 10/547* (2013.01)

(56) References Cited

U.S. PATENT DOCUMENTS

| | | |
|---|---|---|
| 2008/0035985 A1 | 2/2008 | Hayashi et al. |
| 2014/0054442 A1 | 2/2014 | Huang et al. |
| 2014/0239156 A1 | 8/2014 | Hayashi et al. |
| 2016/0343891 A1 | 11/2016 | Heo et al. |
| 2016/0351738 A1 | 12/2016 | Choi et al. |
| 2016/0359082 A1 | 12/2016 | Heo et al. |
| 2017/0005283 A1 | 1/2017 | Al-Ghamdi et al. |
| 2017/0048429 A1 | 2/2017 | Takita |
| 2017/0250304 A1 | 8/2017 | Choi et al. |
| 2018/0145190 A1 | 5/2018 | Lee et al. |

FOREIGN PATENT DOCUMENTS

| | | |
|---|---|---|
| KR | 10-1481000 B1 | 1/2015 |
| KR | 10-1558801 B1 | 10/2015 |
| WO | WO-2016/025051 A2 | 2/2016 |

OTHER PUBLICATIONS

Zhang et al. "Solution-Processed Graphene Quantum Dot Deep-UV Photodetectors", ACSnano, vol. 9, No. 2, 1561 (2015).

Ting et al., "Antimonide-based barrier infrared detectors", Proceedings of SPIE, vol. 7660, 76601R-1.

Li et al, "Carbon and Graphene Quantum Dots for Optoelectronic and Energy Devices: A Review", Advanced Function Materials, 2015, 25, 4929-4947.

Li et al. "Electronic and Optical Properties of Edge-Functionalized Graphene Quantum Dots and the Underlying Mechanism", Journal of Physical Chemistry C, 2015, 119, 24950-24957.

Ryu et al., "Facile method to sort graphene quantum dots by size through ammonium sulfate addition", RSC Advances, 2014, 4, 56848.

Du et al. "Insight into the effect of functional groups on visible-fluorescence emission of graphene quantum dots", Journal of Materials Chemistry C, 2016, 4, 2235.

Tetsuka, et al. "Graphene/nitrogen-functionalized graphene quantum dot hybrid broadband photodetectors with a buffer layer of boron nitride nanosheets," Nanoscale, vol. 8, pp. 19677-19683 (2016).

Extended European Search Report dated May 16, 2018 issued in corresponding European Application No. 17194197.4.

* cited by examiner

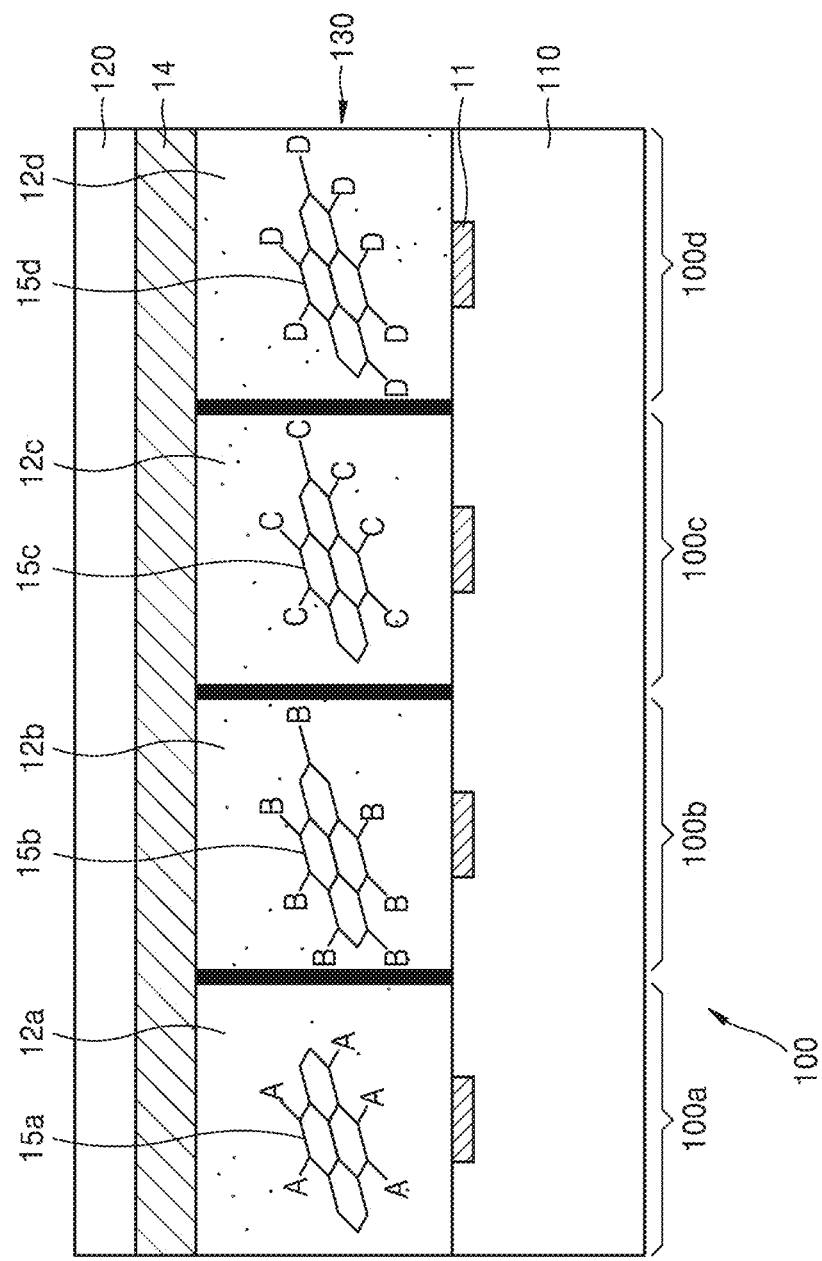

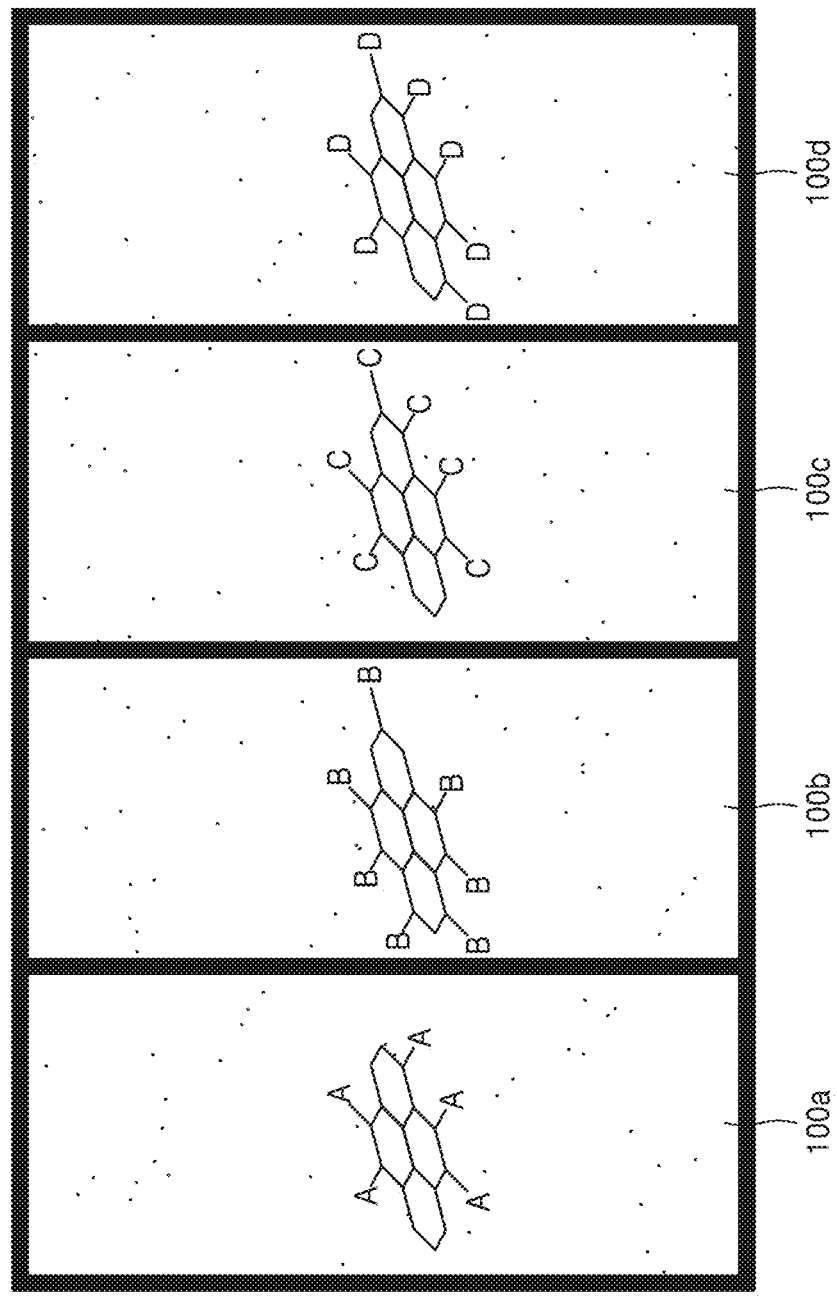

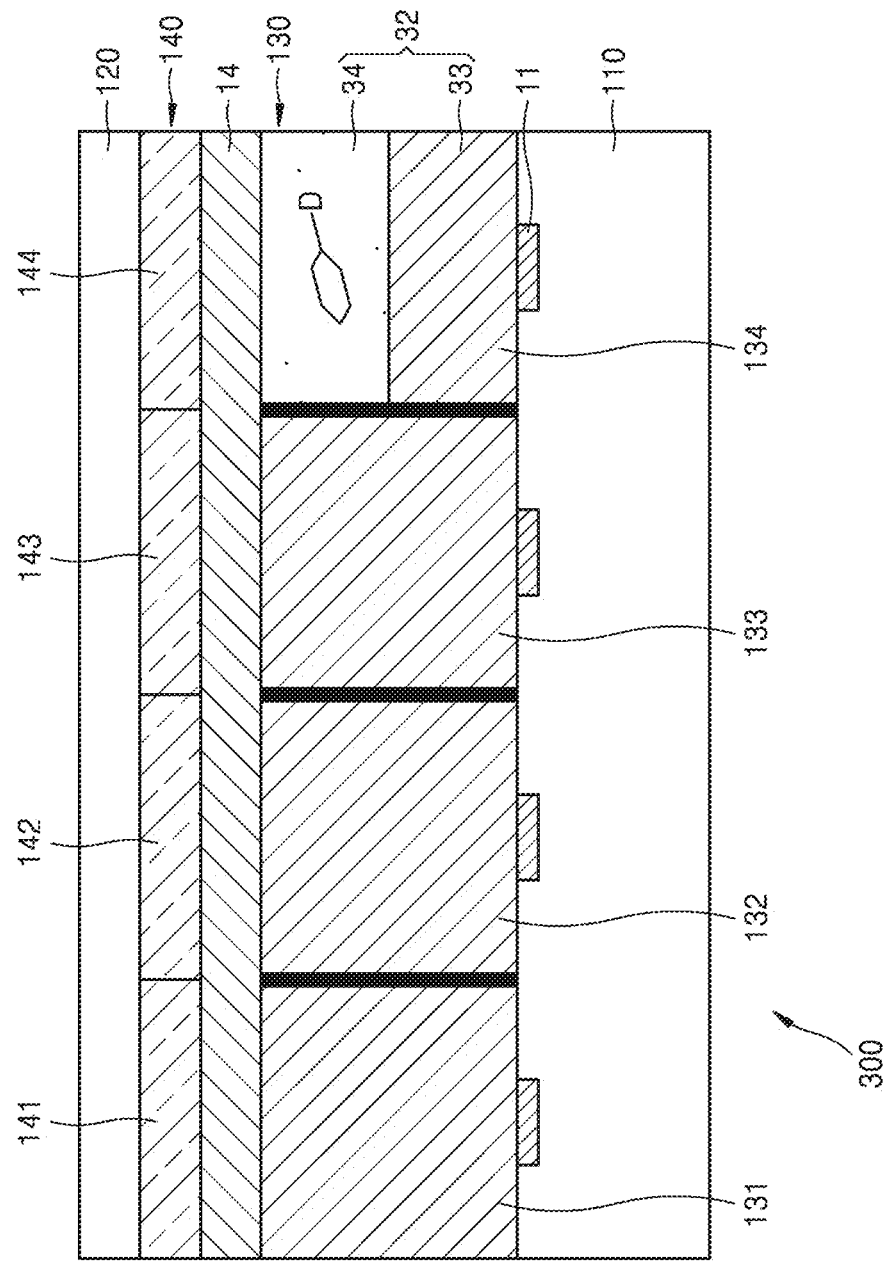

OPTICAL SENSOR AND IMAGE SENSOR INCLUDING GRAPHENE QUANTUM DOTS

CROSS-REFERENCE TO RELATED APPLICATIONS

This application is a continuation of U.S. application Ser. No. 15/825,344, filed Nov. 29, 2017, which claims priority under 35 U.S.C. § 119 to Korean Patent Application Nos. 10-2017-0003399, filed on Jan. 10, 2017, and 10-2017-0035505, filed on Mar. 21, 2017, in the Korean Intellectual Property Office, the disclosures of each of which are incorporated herein in their entirety by reference.

BACKGROUND

1. Field

The present disclosure relates to an optical sensor, an image sensor, and/or more particularly, to an optical sensor and/or image sensor including graphene quantum dots to which a functional group is bonded.

2. Description of Related Art

Silicon semiconductors commonly used in optical sensors and/or image sensors exhibit significantly lower quantum efficiencies for the infrared ray band compared to quantum efficiencies thereof for the visible ray band. Therefore, other materials are being developed for optical sensors and/or image sensors. Optical sensors may be used for various purposes, including as a biometric authentication sensor, a low-light sensitivity enhancing device, a night vision sensor, and an autonomous navigation sensor.

SUMMARY

According to some example embodiments, an optical sensor includes a first electrode, a graphene quantum dot layer, and a second electrode on the graphene quantum dot layer. The graphene quantum dot layer includes a plurality of first graphene quantum dots bonded to a first functional group and a plurality of second graphene quantum dots bonded to a second functional group that is different from the first functional group. The graphene quantum dot layer may be on the first electrode.

In some example embodiments, the first functional group may be bonded to one or more carbon atoms at an outermost portion of the plurality of first graphene quantum dots, and the second functional group may be bonded to one or more carbon atoms disposed at an outermost portion of the plurality of second graphene quantum dots.

In some example embodiments, the plurality of first graphene quantum dots may be configured to absorb light of a first wavelength band, and the plurality of second graphene quantum dots may be configured to absorb light of a second wavelength band that is different from the first wavelength band.

In some example embodiments, the graphene quantum dot layer may further include a plurality of third graphene quantum dots bonded to a third functional group that is different from the first functional group and the second functional group, and the plurality of third graphene quantum dots may be configured to absorb light of a third wavelength band that is different from the first and second wavelength bands.

In some example embodiments, each of the first functional group and the second functional group may include at least one of $-NO_2$, $-NH_2$, $-CH_3$, $-OH$, $-COOH$, $=O$, $-CHO$, $-COCH_3$, $-(C=O)-$, $-F$, $-H$, $-CO-N(CH_3)_2$, $-CH_2-OH$, $-CO-NH_2$, $-N(CH_3)_2$, alkylamine, aniline, or polyethylene glycol (PEG).

In some example embodiments, the plurality of first graphene quantum dot may have a first size, and the plurality of second graphene quantum dots may have a second size that is different from the first size.

In some example embodiments, the graphene quantum dot layer may have a thickness that ranges from about 50 nm to about 100 µm, for example.

In some example embodiments, the optical sensor may further include a semiconductor layer between the first electrode and the graphene quantum dot layer.

In some example embodiments, the semiconductor layer may include at least one of silicon, a compound semiconductor material, an organic semiconductor material, and a 2-dimensional semiconductor material having a band gap and a 2-dimensional crystal structure, and the semiconductor material may form a Schottky barrier between the semiconductor layer and the first electrode.

In some example embodiments, an energy difference between the lowest unoccupied molecular orbital (LUMO) energy level of the graphene quantum dot layer and the valence band of the semiconductor layer may be smaller than an energy difference between the work function of the first electrode and the conduction band of the semiconductor layer.

In some example embodiments, the 2-dimensional semiconductor material may include a transition metal dichalcogenide (e.g., a compound of a transition metal and a chalcogen element).

In some example embodiments, the transition metal may include at least one of tin (Sn), niobium (Nb), tantalum (Ta), molybdenum (Mo), tungsten (W), hafnium (Hf), titanium (Ti), or rhenium (Re), and the chalcogen element may include at least one of sulfur (S), selenium (Se), or tellurium (Te).

In some example embodiments, the semiconductor layer may include a first semiconductor layer on the first electrode and a second semiconductor layer on the first semiconductor layer. The first semiconductor layer may be doped to a first conductivity type, and the second semiconductor layer may be doped to a second conductivity type that is electrically opposite the first conductivity type.

In some example embodiments, the second electrode may be a transparent electrode.

In some example embodiments, the optical sensor may include an optical sensing layer on the first electrode and the optical sensing layer may include the graphene quantum dot layer.

According to some example embodiments, an optical sensor includes a first electrode, a semiconductor layer on the first electrode, a graphene quantum dot layer on the semiconductor layer, and a second electrode on the graphene quantum dot layer. The graphene quantum dot layer includes a plurality of first graphene quantum dots bonded to a first functional group, A material of the semiconductor layer forms a Schottky barrier between the semiconductor layer and the first electrode.

In some example embodiments, an energy difference between the lowest unoccupied molecular orbital (LUMO) energy level of the graphene quantum dot layer and the valence band of the semiconductor layer may be smaller than an energy difference between the work function of the first electrode and the conduction band of the semiconductor layer.

In some example embodiments, the graphene quantum dot layer may further include a plurality of second graphene quantum dots bonded to a second functional group that is different from the first functional group. The plurality of first graphene quantum dots may be configured to absorb light of a first wavelength band, and the plurality of second graphene quantum dots may be configured to absorb light of a second wavelength band that is different from the first wavelength band.

In some example embodiments, the semiconductor layer may include a first semiconductor layer on the first electrode and a second semiconductor layer on the first semiconductor layer. The first semiconductor layer may be doped to a first conductivity type, and the second semiconductor layer may be doped to a second conductivity type that is electrically opposite the first conductivity type.

In some example embodiments, the optical sensor may include a plurality of semiconductor layers and a plurality of graphene quantum dot layers that are alternately disposed between the first electrode and the second electrode. The first electrode and the second electrode may face each other. The second electrode may be on the first electrode. The graphene quantum dot layer may include a plurality of first graphene quantum dots bonded to a first functional group. The plurality of semiconductor layers may include a first semiconductor layer on the first electrode and a second semiconductor layer between two adjacent graphene quantum dot layers among the plurality of graphene quantum dot layers. The first semiconductor layer may be the semiconductor layer such that a material of the first semiconductor layer may form a Schottky barrier between the plurality of semiconductor layers and the first electrode.

In some example embodiments, an energy difference between the lowest unoccupied molecular orbital (LUMO) energy level of the graphene quantum dot layer and the valence band of the first semiconductor layer may be smaller than an energy difference between the work function of the first electrode and the conduction band of the first semiconductor layer, and an energy difference between the highest occupied molecular orbital (HOMO) energy level of the graphene quantum dot layer and the conduction band of the second semiconductor layer may be smaller than an energy difference between the work function of the first electrode and the conduction band of the first semiconductor layer.

In some example embodiments, thicknesses of each of the second semiconductor layers may be configured to allow tunneling in each of the second semiconductor layers.

According to some example embodiments, an image sensor includes the above-described optical sensor and a signal processing layer configured to process an optical signal detected by the optical sensor into an electric signal. The image sensor may include an optical sensing layer on the first electrode. The optical sensing layer may include a first optical sensing layer configured to sense light of a first wavelength band and a second optical sensing layer configured to sense light of a second wavelength that is different from the first wavelength band. The first optical sensing layer may include the first graphene quantum dot layer including the plurality of graphene quantum dots bonded to the first functional group, and the second optical sensing layer including the second graphene quantum dot layer including the plurality of graphene quantum dots bonded to the second functional group that is different from the first functional group.

In some example embodiments, the optical sensing layer may further include a third graphene quantum dot layer including a plurality of graphene quantum dots bonded to a third functional group that is different from the first and second functional groups; and a fourth graphene quantum dot layer including a plurality of graphene quantum dots bonded to a fourth functional group that is different from the first through third functional groups.

In some example embodiments, sizes of the first through fourth graphene quantum dots may be different from one another.

According to some example embodiments, an optical sensor includes a first electrode, a graphene quantum dot layer on the first electrode, and a second electrode on the graphene quantum dot layer. The graphene quantum dot layer includes a plurality of first graphene quantum dots bonded to a first functional group and a plurality of second graphene quantum dots bonded to a second functional group that is different from the first functional group.

In some example embodiments, the plurality of first graphene quantum dots may be configured to absorb light of a first wavelength band, and the plurality of second graphene quantum dots may be configured to absorb light of a second wavelength band that is different from the first wavelength band.

In some example embodiments, each of the first functional group and the second functional group may include at least one of —NO$_2$, —NH$_2$, —CH$_3$, —OH, —COOH, =O, —CHO, —COCH$_3$, —(C=O)—, —F, —H, —CO—N(CH$_3$)$_2$, —CH$_2$—OH, —CO—NH$_2$, —N(CH$_3$)$_2$, alkylamine, aniline, or polyethylene glycol (PEG).

In some example embodiments, the optical sensor may further include a semiconductor layer between the first electrode and the graphene quantum dot layer.

In some example embodiments, an image sensor may include the optical sensor and a signal processing layer configured to process an optical signal detected by the optical sensor into an electric signal.

BRIEF DESCRIPTION OF THE DRAWINGS

These and/or other aspects will become apparent and more readily appreciated from the following description of some example embodiments, taken in conjunction with the accompanying drawings in which:

FIG. 9A is a schematic cross-sectional view of a structure of one pixel of an image sensor according to some example embodiments;

FIGS. 9B and 9C are plan view diagrams showing example arrangements of sub-pixels in the one pixel of the image sensor shown in FIG. 9A;

FIG. 11 is a schematic cross-sectional view of a structure of one pixel of an image sensor according to some example embodiments.

DETAILED DESCRIPTION

Figure 1:
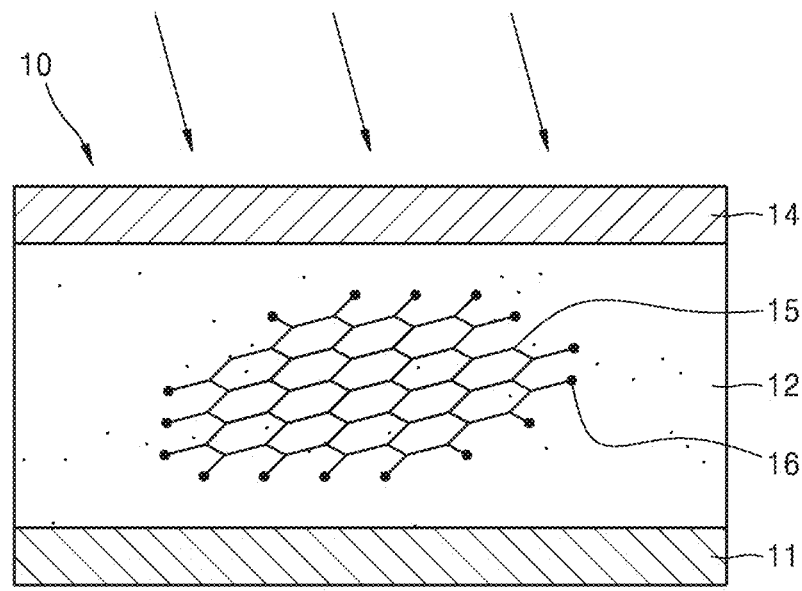
FIG. 1 is a schematic cross-sectional view of a structure of an optical sensor according to some example embodiments.

Reference will now be made in detail to embodiments, examples of which are illustrated in the accompanying drawings, wherein like reference numerals refer to like elements throughout. In this regard, example embodiments may have different forms and should not be construed as being limited to the descriptions set forth herein. Therefore, the embodiments are merely described below, by referring to the figures, to explain aspects. Expressions such as "at least one of," when preceding a list of elements, modify the entire list of elements and do not modify the individual elements of the list. Furthermore, in the layer structures described below, the expressions "above" or "on" may indicate not only that an element is contacting immediately above another element, but also that an element is above another element without any contact therebetween.

FIG. 1 is a schematic cross-sectional view of the structure of an optical sensor according to some example embodiments. Referring to FIG. 1, an optical sensor 10 according to some example embodiments may include a first electrode 11, an optical sensing layer 12 disposed on the first electrode 11, and a second electrode 14 disposed on the optical sensing layer 12. The first electrode 11 and the second electrode 14 may include any conductive material including a metal, graphene, a transparent conductive oxide, or a transparent conductive nitride. For example, the second electrode 14 disposed in a direction in which light is incident may include a transparent conductive material. In other words, the second electrode 14 may be a transparent electrode having transparency with respect to light of a wavelength band to be detected.

The optical sensing layer 12 may include a plurality of graphene quantum dots 15 as a material for absorbing light to generate a photocurrent. FIG. 1 is an enlarged view of the structure of one graphene quantum dot 15 in the optical sensing layer 12. The graphene quantum dot 15 is a graphene having a small size from about 2 nm to 20 nm and may have the same characteristics as a general quantum dot. For example, unlike common graphene which does not have any band gap, the graphene quantum dot 15 may have a bandgap due to the quantum confinement effect and may control the bandgap according to its size. Therefore, a dark current generated while light is not incident may be suppressed, thereby reducing noise in the optical sensor 10. Since the graphene quantum dot 15 has a 2-dimensional (2D) structure, it may be relatively easy to control the size and density per unit area of the graphene quantum dots 15 as compared with general quantum dots having a 3-dimensional (3D) structure. Therefore, an absorption wavelength band and sensitivity of the optical sensing layer 12 may be easily controlled.

Figure 2:
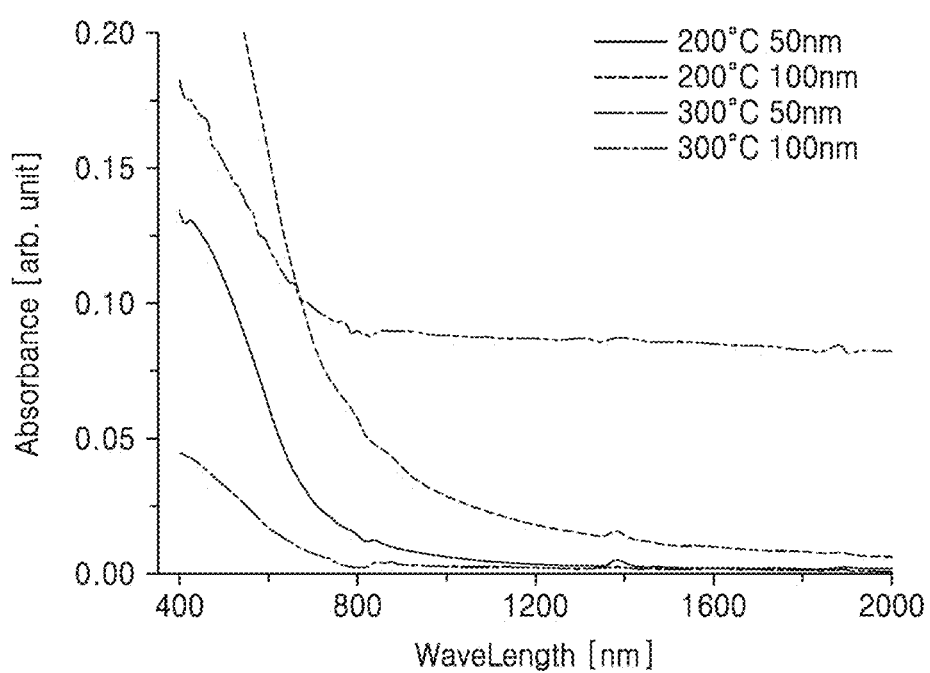
FIG. 2 is a graph showing an example change in absorption characteristics of an optical sensing layer including graphene quantum dots according to process temperatures and thicknesses of the optical sensing layer.

Furthermore, the absorption characteristics of the optical sensing layer 12 may be controlled according to a process temperature of the optical sensing layer 12. The optical sensing layer 12 may be formed by applying a paste including the graphene quantum dots 15 onto the first electrode 11 and then drying the paste by removing a solvent therefrom through a heat treatment. During the forming of the optical sensing layer 12, the absorption characteristics of the optical sensing layer 12 may be adjusted according to a heating temperature and a heating time. For example, FIG. 2 is a graph showing an example change in the absorption characteristics of the optical sensing layer 12 according to process temperatures and thicknesses of the optical sensing layer 12 including the graphene quantum dots 15. Referring to FIG. 2, when the thickness of the optical sensing layer 12 is 100 nm and the optical sensing layer 12 is formed at the temperature of 300° C., the absorption rate of the optical sensing layer 12 in the infrared ray band is significantly increased. For example, the variation of the absorption rate according to wavelengths is small in the infrared band. For example, the optical sensing layer 12, which had a thickness of 100 nm and was formed at a temperature of 300° C., exhibited an absorption coefficient of about 9354.2/cm with respect to incident light having a wavelength of 850 nm and exhibited an absorption coefficient of about 8523.1/cm with respect to incident light having a wavelength of 2000 nm. The thickness of the optical sensing layer 12 may be selected within the range from 50 nm to 100 μm to sufficiently improve the efficiency for detecting incident light.

Furthermore, according to the present embodiment, the optical sensing layer 12 may include a graphene quantum dot 15 to which a functional group 16 is bonded. The functional group 16 may be bonded to one or more carbon atoms disposed at the outermost portions of the graphene quantum dot 15. By bonding the functional group 16 to the outermost portions of the graphene quantum dots 15, the graphene quantum dots 15 may be limited and/or prevented from direct electrical contact to one another. As a result, the dark current may be further suppressed. Furthermore, since the bandgap of the graphene quantum dot 15 varies depending on the type of the functional group 16 bonded to the graphene quantum dot 15, the absorption wavelength band of the optical sensing layer 12 may be effectively controlled. For example, the functional group 16 that may be bonded to the graphene quantum dot 15 may include at least one of —$NO_2$, —$NH_2$, —$CH_3$, —OH, —COOH, =O, —CHO, —$COCH_3$, —(C=O)—, —F, —H, —CO—$N(CH_3)_2$, —$CH_2$—OH, —CO—$NH_2$, —$N(CH_3)_2$, alkylamine, aniline, and polyethylene glycol (PEG). The bandgap of the graphene quantum dot 15 to which the functional group 16 is bonded may vary depending on the types of the functional group 16. For example, when the functional group 16 bonded to the graphene quantum dot 15 is one of —$NH_2$, —OH, —COOH, —CHO, and —$COCH_3$, the bandgap of the graphene quantum dot 15 may be in the order of —$NH_2$>—OH>—CHO>—$COCH_3$>—COOH. The band gap and the absorption wavelength band are inversely proportional to each other. Therefore, according to a desired absorption wavelength band, the functional group 16 that provides a corresponding band gap may be bonded to the graphene quantum dot 15. Furthermore, the plurality of same functional groups 16 may be bonded to the one graphene quantum dot 15, but the two or more different functional groups 16 may also be bonded to the one graphene quantum dot 15.

Figure 3:
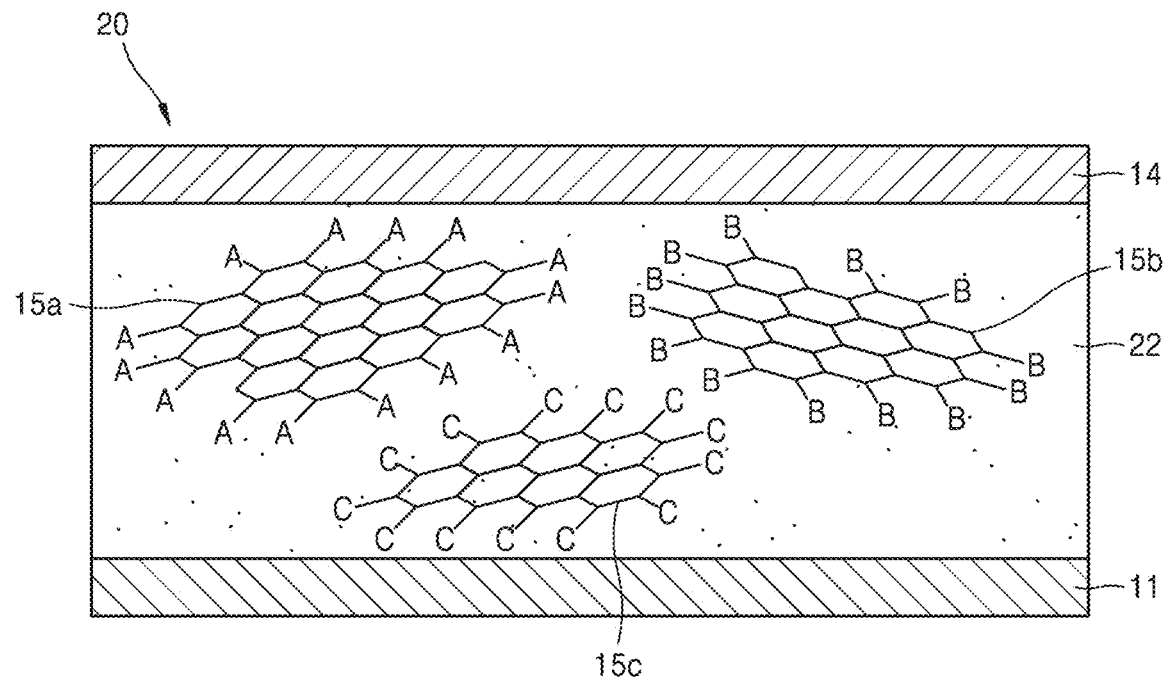
FIG. 3 is a schematic cross-sectional view of a structure of an optical sensor according to some example embodiments.

FIG. 3 is a schematic cross-sectional view of the structure of an optical sensor 20 according to some example embodiments. Referring to FIG. 3, an optical sensing layer 22 may include at least two types of graphene quantum dots 15a, 15b, and 15c that absorb light of different wavelength bands, respectively. For example, the optical sensing layer 22 may include a plurality of first graphene quantum dots 15a bonded to a first functional group A, a plurality of second graphene quantum dots 15b bonded to a second functional group B, and a plurality of third graphene quantum dots 15c bonded to a third functional group C. The first functional group A is bonded to one or more carbon atoms disposed at the outermost portion of the each first graphene quantum dot 15a, the second functional group B is bonded to one or more carbon atoms disposed at the outermost portion of the each second graphene quantum dot 15b, and the third functional group C is bonded to one or more carbon atoms disposed at the outermost portion of the each third graphene quantum dot 15c. Although FIG. 3 shows the three types of graphene quantum dots 15a, 15b and 15c for convenience of explanation, the optical sensing layer 22 may also include only two types of graphene quantum dots or four or more types of graphene quantum dots.

The first graphene quantum dot 15a, the second graphene quantum dot 15b, and the third graphene quantum dot 15c may have different sizes. For example, the first graphene quantum dot 15a may have the first functional group A and a first size to absorb light of a first wavelength band, the second graphene quantum dot 15b may have the second functional group B different from the first functional group A and a second size different from the first size to absorb light of a second wavelength band different from the first wavelength band, and the third graphene quantum dot 15c may have the third functional group C different from the first and second functional group A and B and a third size different from the first and second sizes to absorb light of a third wavelength band different from the first and second wavelength bands. Here, each of the first through third functional groups A, B, and C may be selected from among —$NO_2$, —$NH_2$, —$CH_3$, —OH, —COOH, =O, —CHO, —$COCH_3$, —(C=O)—, —F, —H, —CO—$N(CH_3)_2$, —$CH_2$—OH, —CO—$NH_2$, —$N(CH_3)_2$, alkylamine, aniline, and polyethylene glycol (PEG) as described above.

Figure 4:
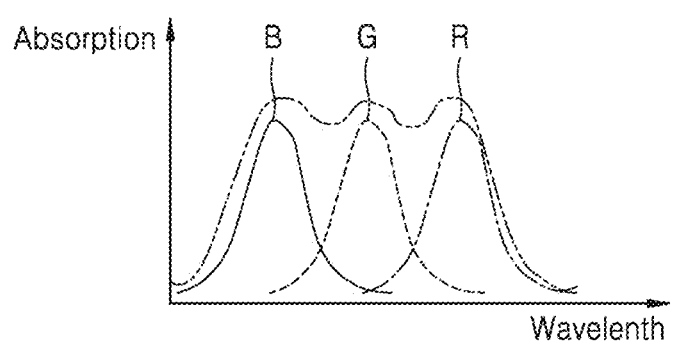
FIG. 4 is a graph providing an example of the absorption characteristics of an optical sensing layer of the optical sensor shown in FIG. 3.

FIG. 4 is a graph providing an example of the absorption characteristics of the optical sensing layer 22 of the optical sensor 20 shown in FIG. 3. For example, the optical sensing layer 22 may include the plurality of first graphene quantum dots 15a configured to absorb light in a blue wavelength band B, the plurality of second graphene quantum dots 15b configured to absorb light in a green wavelength band G, and the plurality of third graphene quantum dot 15c configured to absorb light in a red wavelength band R. Based on combinations of various types of the graphene quantum dots 15a, 15b, and 15c having different absorption characteristics, the optical sensing layer 22 may have a constant absorption rate with respect to the visible ray band. Furthermore, when the optical sensing layer 22 further includes a plurality of graphene quantum dots configured to absorb light in the infrared ray band, the optical sensing layer 22 may exhibit a relatively uniform absorption rate over a wide spectrum range including the visible ray band and the infrared ray band.

Figure 5:
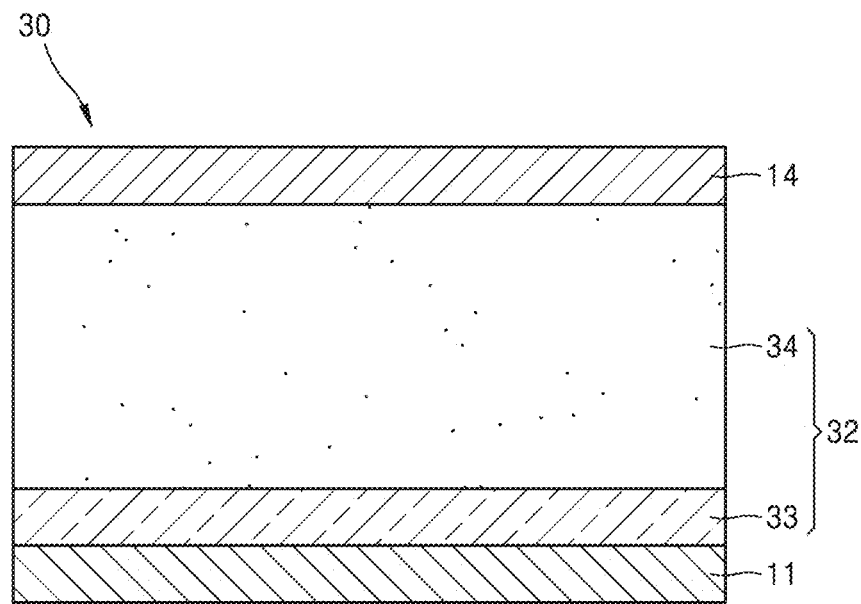
FIG. 5 is a schematic cross-sectional view of a structure of an optical sensor according to some example embodiments.

FIG. 5 is a schematic cross-sectional view of a structure of an optical sensor according to some example embodiments. Referring to FIG. 5, an optical sensor 30 may include the first electrode 11, an optical sensing layer 32 disposed on the first electrode 11, and the second electrode 14 disposed on the optical sensing layer 32. Furthermore, the optical sensing layer 32 may also include a semiconductor layer 33 disposed on the first electrode 11 and a graphene quantum dot layer 34 disposed on the semiconductor layer 33. Here, the graphene quantum dot layer 34 may include a plurality of graphene quantum dots like the optical sensing layer 12 shown in FIG. 1 or the optical sensing layer 22 shown in FIG. 3. As described above with reference to FIGS. 1 and 3, the graphene quantum dot layer 34 may include at least one kind of graphene quantum dots each bonded to at least one functional group. In other words, the descriptions of the optical sensing layers 12 and 22 shown in FIGS. 1 and 3 may be applied to the graphene quantum dot layer 34 as they are. In this regard, it may be considered that each of the optical sensing layers 12 and 22 shown in FIGS. 1 and 3 include one graphene quantum dot layer.

The semiconductor layer 33 forms a Schottky barrier at the interface between the semiconductor layer 33 and the first electrode 11. Due to the Schottky barrier, electrons may be limited and/or prevented from easily moving from the first electrode 11 to the graphene quantum dot layer 34 through the semiconductor layer 33 while light is not incident. Therefore, the semiconductor layer 33 may further suppress the dark current.

Figure 6A:
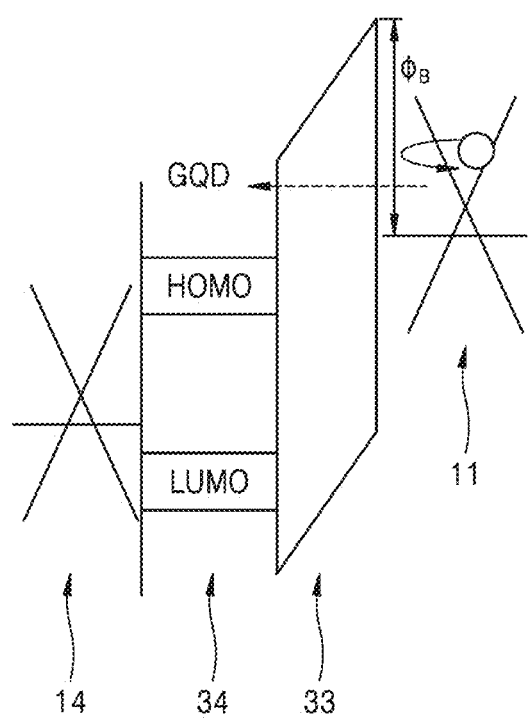
FIGS. 6A and 6B are example energy band diagrams of the optical sensor shown in FIG. 5.
Figure 6B:
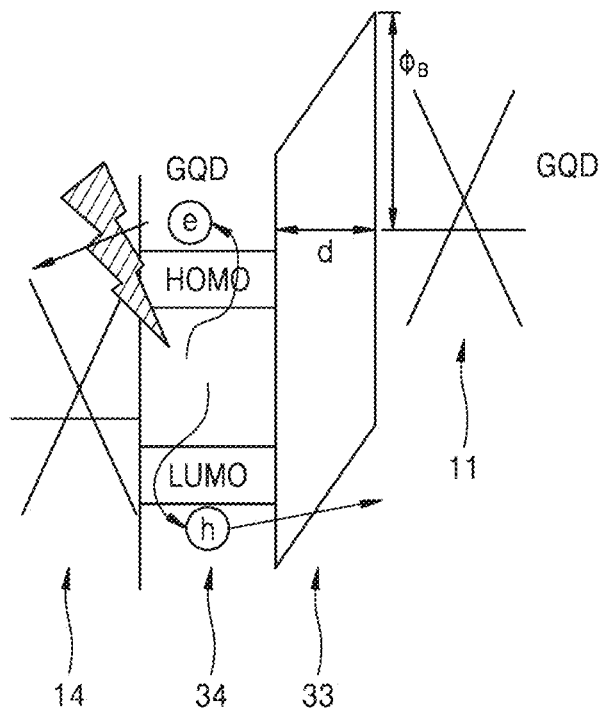

For example, FIGS. 6A and 6B show example energy band diagrams of the optical sensor 30 shown in FIG. 5. FIG. 6A is an energy band diagram while voltages are applied to the first and second electrodes 11 and 14 and light is not incident to the optical sensor 30. FIG. 6B is an energy band diagram while voltages are applied to the first and second electrodes 11 and 14 and light is incident to the optical sensor 30. In FIGS. 6A and 6B, it is assumed that the first and second electrodes 11 and 14 include graphene. First, referring to FIG. 6A, electrons may hardly move from the first electrode 11 to the semiconductor layer 33, because an energy difference ΦB between the work function of the first electrode 11 and the conduction band of the semiconductor layer 33 is large. Therefore, the dark current may be suppressed in a state in which no light is incident to the optical sensor 30. On the contrary, as shown in FIG. 6B, when light is incident to the optical sensor 30, electrons e and holes h are generated in the graphene quantum dot layer 34, and thus a photocurrent flows. For example the electrons e generated in the graphene quantum dot layer 34 may move to the second electrode 14 along an electric field applied between the first electrode 11 and the second electrode 14. Furthermore, the holes h generated in the graphene quantum dot layer 34 may move to the first electrode 11 through the semiconductor layer 33. When a material having sufficient small energy difference between a lowest unoccupied molecular orbital (LUMO) energy level of the graphene quantum dot layer 34 and a valence band of the semiconductor layer 33 is selected as the semiconductor layer 33, the holes h generated in the quantum dot layer 34 may easily move to the semiconductor layer 33. For example, the energy difference between the LUMO energy level of the graphene quantum dot layer 34 and the valence band of the semiconductor layer 33 may be smaller than the energy difference between a work function of the first electrode 11 and a conduction band of the semiconductor layer 33. For example, the energy difference between the LUMO energy level of the graphene quantum dot layer 34 and the valence band of the semiconductor layer 33 may be half the difference between the work function of the first electrode 11 and the conduction band of the semiconductor layer 33 or smaller.

The material constituting the semiconductor layer 33 may be any semiconductor material capable of satisfying the above-described relationships between the semiconductor layer 33 and the first electrode 11 and between the semiconductor layer 33 and the graphene quantum dot layer 34. For example, other than common semiconductor materials including silicon (Si) and germanium (Ge), compound semiconductor materials, organic semiconductor materials, or 2D semiconductor materials having band gaps and 2D crystal structures may be used as the material constituting the semiconductor layer 33. For example, since the graphene quantum dot layer 34 includes graphene quantum dots having a 2D structure, the plurality of graphene quantum dots of the graphene quantum dot layer 34 may be easily aligned by using a second semiconductor material for constituting the semiconductor layer 33. The example of second semiconductor materials is a transition metal dichalcogenide (TMD), which is a compound of a transition metal and a chalcogen element. For example, the transition metal may include at least one of tin (Sn), niobium (Nb), tantalum (Ta), molybdenum (Mo), tungsten (W), hafnium (Hf), titanium (Ti), and rhenium (Re), whereas the chalcogen element may include at least one of sulfur (S), selenium (Se), and tellurium (Te). For example, the TMD may include $MoS_2$, $WS_2$, $TaS_2$, $HfS_2$, $ReS_2$, $TiS_2$, $NbS_2$, $SnS_2$, $MoSe_2$, $WSe_2$, $TaSe_2$, $HfSe_2$, $ReSe_2$, $TiSe_2$, $NbSe_2$, $SnSe_2$, $MoTe_2$, $WTe_2$, $TaTe_2$, $HfTe_2$, $ReTe_2$, $TiTe_2$, $NbTe_2$, $SnTe_2$. There are various 2D semiconductor materials other than the TMD. For example, the 2D semiconductor materials may include h-BN (hexagonal BN), phosphorene, $TiOx$ ($1 \le x \le 2$), $NbOx$ ($1 \le x \le 2$), $MnOx$ ($1 \le x \le 2$), $VaOx$ ($1 \le x \le 2$), $MnO_3$, $TaO_3$, $WO_3$, $MoCl_2$, $CrCl_3$, $RuCl_3$, $BiI_3$, $PbCl_4$, GeS, GaS, GeSe, GaSe, $PtSe_2$, $In_2Se_3$, GaTe, InS, InSe, and InTe. h-BN is a hexagonal crystal structure based on a combination of boron (B) and nitrogen (N). Phosphorine is a 2D allotrope of black phosphorus.

Furthermore, the semiconductor layer 33 may also absorb light in addition to suppression of the dark current. Although FIG. 5 shows that the semiconductor layer 33 is disposed directly above the first electrode 11 and the graphene quantum dot layer 34 is disposed directly below the transparent second electrode 14, the positions of the semiconductor layer 33 and the quantum dot layer 34 may be interchanged. In other words, the graphene quantum dot layer 34 may be disposed on the first electrode 11, the semiconductor layer 33 may be disposed on the graphene quantum dot layer 34, and the transparent second electrode 14 may be disposed on the semiconductor layer 33. In this case, a Schottky barrier is formed at the interface between the semiconductor layer 33 and the second electrode 14.

Furthermore, when the semiconductor layer 33 is disposed over the graphene quantum dot layer 34, the semiconductor layer 33 may absorb light of a certain wavelength band from the incident light and transmit light of another wavelength band, such that the transmitted light reaches the graphene quantum dot layer 34. For example, the semiconductor layer 33 may include a semiconductor material to absorb light of the visible ray band and transmit light of the infrared ray band. In this case, the graphene quantum dot layer 34 may be configured to absorb light of the infrared ray band. Alternatively, the graphene quantum dot layer 34 may be configured to absorb light of both the visible ray band and the infrared ray band in order to sense light of the visible ray band that is not completely absorbed by the semiconductor layer 33.

Figure 7:
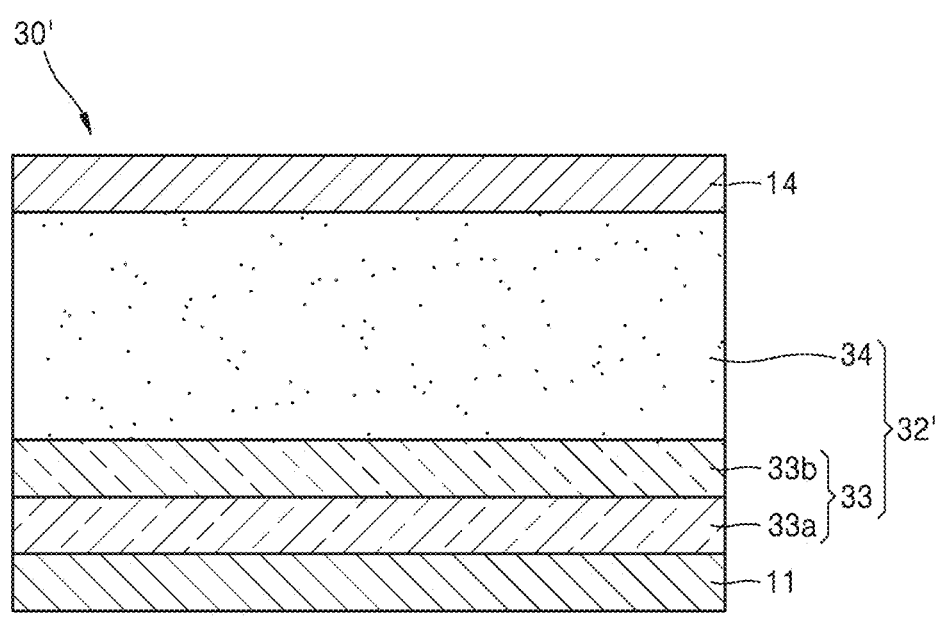
FIG. 7 is a schematic cross-sectional view of a structure of an optical sensor according to some example embodiments.

FIG. 7 is a schematic cross-sectional view of the structure of an optical sensor according to some example embodiments. Referring to FIG. 7, an optical sensor 30' includes the first electrode 11, an optical sensing layer 32' disposed on the first electrode 11, and the second electrode 14 disposed on the optical sensing layer 32'. Furthermore, the optical sensing layer 32' may also include the semiconductor layer 33 disposed on the first electrode 11 and the graphene quantum dot layer 34 disposed on the semiconductor layer 33. The semiconductor layer 33 may include a first semiconductor layer 33a disposed on the first electrode 11 and a second semiconductor layer 33b disposed on the first semiconductor layer 33a. Here, the first semiconductor layer 33a is doped to a first conductivity type and the second semiconductor layer 33b is doped to a second conductivity type that is electrically opposite the first conductivity type. For example, when the first electrode 11 is a cathode and the second electrode 14 is an anode, the first semiconductor layer 33a may be doped to be n-type and the second semiconductor layer 33b may be doped to be p-type. On the contrary, when the first electrode 11 is an anode and the second electrode 14 is a cathode, the first semiconductor layer 33a may be doped to be p-type and the second semiconductor layer 33b may be doped to be n-type. Therefore, according to the present embodiment, the semiconductor layer 33 has a PN junction structure. A built-in potential barrier may be additionally formed in the semiconductor layer 33, because the semiconductor layer 33 has a PN junction structure. Therefore, the dark current may be further suppressed.

Figure 8:
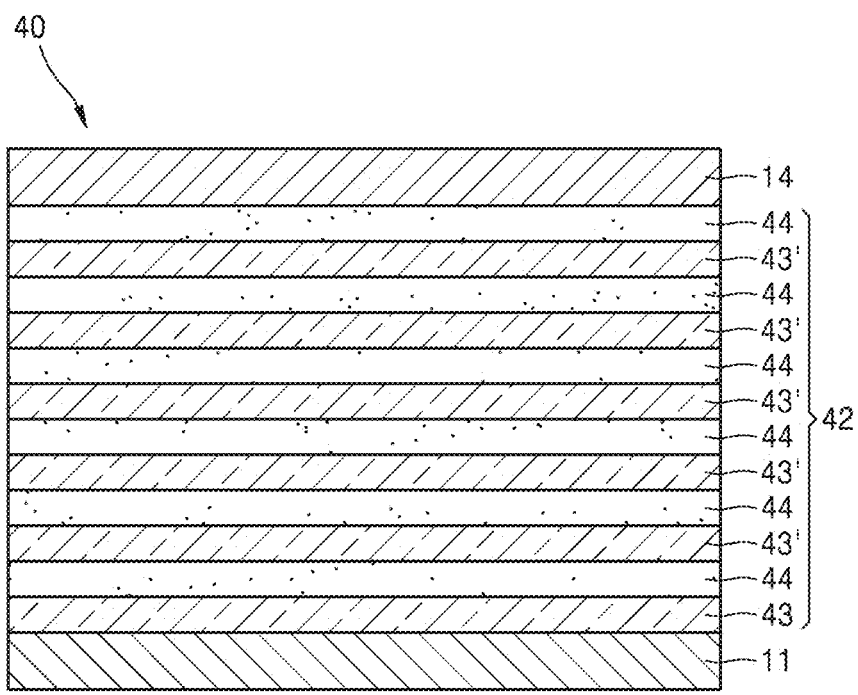
FIG. 8 is a schematic cross-sectional view of a structure of an optical sensor according to some example embodiments.

FIG. 8 is a schematic cross-sectional view of a structure of an optical sensor according to some example embodiments. Referring to FIG. 8, an optical sensor 40 may include the first electrode 11, an optical sensing layer 42 disposed on the first electrode 11, and the second electrode 14 disposed on the optical sensing layer 42. The optical sensing layer 42 may include a plurality of semiconductor layers 43 and 43' and a plurality of graphene quantum dot layers 44, which are disposed alternately between the first electrode 11 and the second electrode 14.

Here, the first semiconductor layer 43 disposed directly above the first electrode 11 may include a semiconductor material as described with reference to FIG. 5. In other words, a material constituting the first semiconductor layer 43 may be selected, such that the energy difference between the LUMO energy level of the graphene quantum dot layer 44 and the valence band of the first semiconductor layer 43 is small and the energy difference between the work function of the first electrode 11 and the conduction band of the first semiconductor layer 43 is large. For example, the energy difference between the work function of the first electrode 11 and the conduction band of the first semiconductor layer 43 may be greater than the energy difference between the LUMO energy level of the graphene quantum dot layer 44 and the energy of the valence band of the first semiconductor layer 43. On the other hand, for easy movements of electrons and holes, a material constituting the second semiconductor layer 43' disposed between the two graphene quantum dot layers 44 adjacent to each other is selected, such that the energy difference between a highest occupied molecular orbital (HOMO) energy level of the graphene quantum dot layer 44 and the conduction band of the second semiconductor layer 43' is small. For example, the energy difference between the HOMO energy level of the graphene quantum dot layer 44 and the conduction band of the second semiconconductor layer 43' may be smaller than the energy difference between the work function of the first electrode 11 and the conduction band of the first semiconductor layer 43. Furthermore, thickness of each of the second semiconductor layers 43' may be selected, such that tunneling occurs in each of the second semiconductor layer 43'.

The graphene quantum dot layer 44 may be identical to the optical sensing layers 12 and 22 as described above with reference to FIGS. 1 and 3. The plurality of semiconductor layers 43 and 43' and the plurality of graphene quantum dot layers 44 may constitute a multi-quantum well (MQW) structure. For example, the plurality of semiconductor layers 43 and 43' may serve as barrier layers and the plurality of graphene quantum dot layers 44 may serve as a quantum well layer.

The above-described optical sensors 10, 20, 30, 30', and 40 may be fabricated as individual optical sensing electronic elements, such as photodiodes, and mounted in electronic devices. Furthermore, an image sensor for photographing a 2D image by using the above-described optical sensors 10, 20, 30, 30', and 40 may be manufactured.

For example, FIG. 9A is a schematic cross-sectional view of the structure of one pixel of an image sensor according to some example embodiments. Referring to FIG. 9A, one pixel of the image sensor 100 may include a signal processing layer 110, the first electrode 11, an optical sensing layer 130, the second electrode 14, and a transparent protection layer 120. The signal processing layer 110 may be coupled to the optical sensing layer 130.

The optical sensing layer 130 may include a plurality of optical sensing layers 12a, 12b, 12c, and 12d disposed side-by-side on a same layer. For example, the optical sensing layers 12a, 12b, 12c, and 12d may have the same structure as the optical sensing layer 12 shown in FIG. 1. In other words, a first optical sensing layer 12a may include a first graphene quantum dot layer having the plurality of first graphene quantum dots 15a bonded to the first functional group A, a second optical sensing layer 12b may include a second graphene quantum dot layer having the plurality of second graphene quantum dots 15b bonded to the second functional group B, a third optical sensing layer 12c may include a third graphene quantum dot layer having the plurality of third graphene quantum dots 15c bonded to the third functional group C, and a fourth optical sensing layer 12d may include a fourth graphene quantum dot layer having a plurality of fourth graphene quantum dots 15d bonded to a fourth functional group D. Although FIG. 9A shows that each of the first through fourth optical sensing layers 12a, 12b, 12c and 12d include only one of the first through fourth graphene quantum dot 15a, 15b, 15c and 15d, each of the first through fourth optical sensing layers 12a, 12b, 12c and 12d may also include two or more types of graphene quantum dots.

The first functional group A of the first graphene quantum dot 15a may be selected to absorb light of a first wavelength band, the second functional group B of the second graphene quantum dot 15b may be selected to absorb light of a second wavelength band, the third functional group C of the third graphene quantum dot 15c may be selected to absorb light of a third wavelength band, and the fourth functional group D of the fourth graphene quantum dot 15d may be selected to absorb light of a fourth wavelength band. Furthermore, the sizes of first through fourth graphene quantum dots 15a, 15b, 15c, and 15d may be selected to be different from one another in correspondence to the respective absorption wavelength bands thereof. In such a structure, the first optical sensing layer 12a detects light of the first wavelength band, the second optical sensing layer 12b detects light of the second wavelength band, the third optical sensing layer 12c detects light of the third wavelength band, and the fourth optical sensing layer 12d detects light of the fourth wavelength band. For example, the first optical sensing layer 12a may be configured to detect blue light, the second optical sensing layer 12b may be configured to detect green light, the third optical sensing layer 12c may be configured to detect red light, and the fourth optical sensing layer 12d may be configured to detect an infrared ray. For example, the fourth optical sensing layer 12d is capable of detecting light of the near-infrared ray wavelength band within the range from about 800 nm to about 900 nm, for example. To this end, the fourth graphene quantum dot 15d may be configured to have a bandgap of about 1.38 eV or less.

The first electrode 11 may be a pixel electrode, and the plurality of first electrodes 11 respectively connected to the first through fourth optical sensing layers 12a, 12b, 12c, and 12d may be disposed. The second electrode 14 is a common electrode, and the one second electrode 14 may be connected to the first through fourth optical sensing layer 12a, 12b, 12c, and 12d in common. Furthermore, the second electrode 14 may be a transparent electrode that is transparent to visible rays and an infrared ray. The transparent protective layer 120 having an insulating property may be disposed on the second electrode 14. Furthermore, the signal processing layer 110 processes an optical signal detected by the optical sensing layer 130 into an electrical signal. To this end, the signal processing layer 110 is connected to the plurality of first electrodes 11. The signal processing layer 110 may include, for example, an integrated circuit.

Figure 9C:
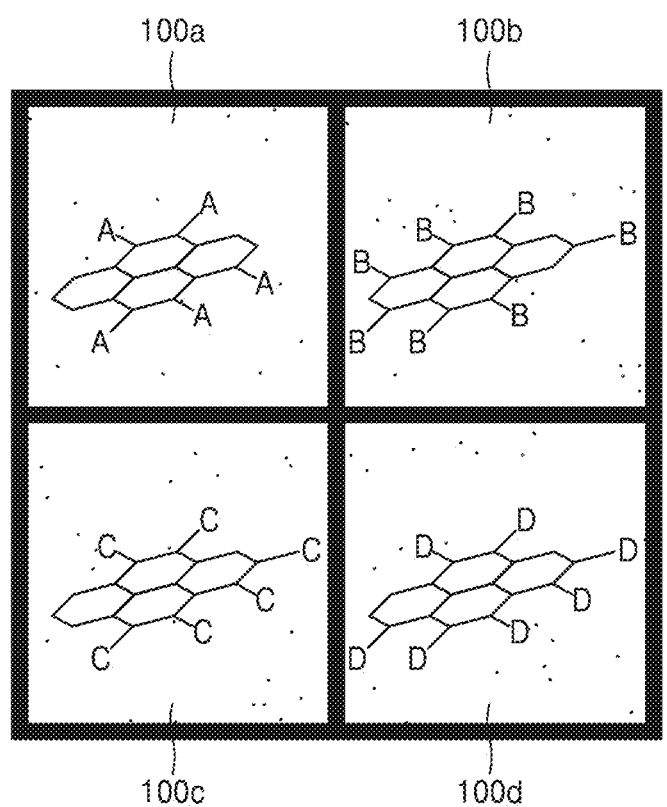

In the images sensor 100 shown in FIG. 9A, areas respectively corresponding to the first through fourth optical sensing layer 12a, 12b, 12c and 12d may be sub-pixels 100a, 100b, 100c and 100d, and one group including the sub-pixels 100a, 100b, 100c, and 100d may be a pixel. For example, the first sub-pixel 100a may be a region for sensing light of a first wavelength band in one pixel, the second sub-pixel 100b may be a region for sensing light of a second wavelength band in one pixel, the third sub-pixel 100c may be a region for sensing light of a third wavelength band in one pixel, and the fourth sub-pixel 100d may be a region for sensing light of a fourth wavelength band in one pixel. FIGS. 9B and 9C are plan view diagram showing example arrangements of the sub-pixels 100a, 100b, 100c, and 100d in one pixel of the image sensor 100 shown in FIG. 9A. As shown in FIG. 9B, the sub-pixels 100a, 100b, 100c, and 100d may be disposed in a row. Alternatively, as shown in FIG. 9C, the sub-pixels 100a, 100b, 100c, and 100d may be 2-dimensionally disposed in the shape of a 2×2 matrix. Since the image sensor 100 exhibits high detection efficiency with respect to light of the infrared ray band, the sub-pixels 100a, 100b, 100c, and 100d may be configured to have a same size as shown in FIGS. 9B and 9C.

Figure 10:
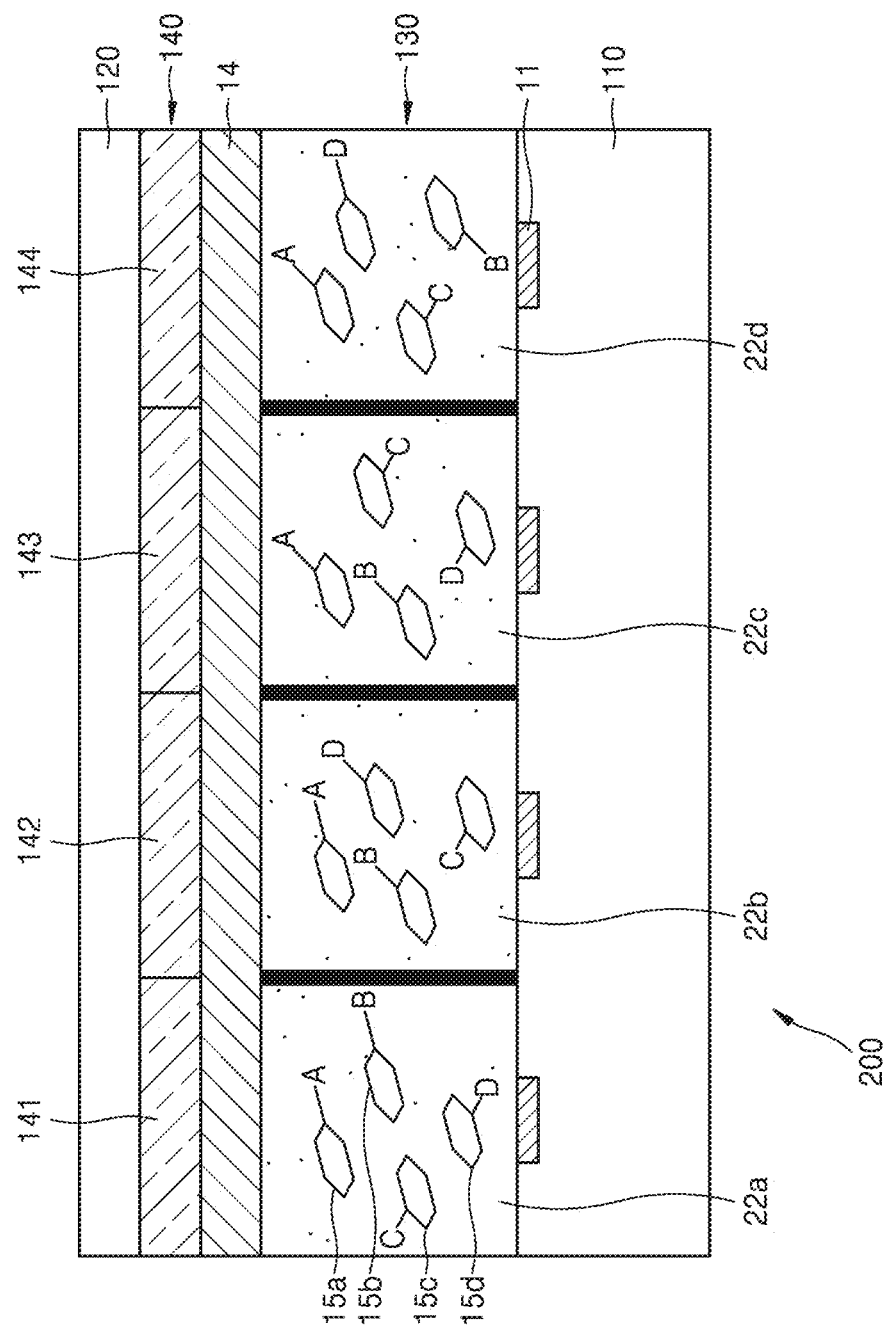
FIG. 10 is a schematic cross-sectional view of a structure of one pixel of an image sensor according to some example embodiments.

FIG. 10 is a schematic cross-sectional view of the structure of one pixel of an image sensor 200 according to some example embodiments. Referring to FIG. 10, the optical sensing layer 130 may include a plurality of optical sensing layers 22a, 22b, 22c, and 22d disposed side-by-side on a same layer. For example, the optical sensing layers 22a, 22b, 22c, and 22d may have the same structure as the optical sensing layer 22 shown in FIG. 3. In other words, each of the optical sensing layers 22a, 22b, 22c, 22d may include at least the plurality of first through fourth graphene quantum dots 15a, 15b, 15c, 15d that respectively absorb light of first through fourth wavelength bands different from one another. For example, each of the optical sensing layers 22a, 22b, 22c and 22*d* may include the plurality of first graphene quantum dots 15*a* bonded to the first functional group A, the plurality of second graphene quantum dots 15*b* bonded to the second functional group B, the plurality of third graphene quantum dots 15*c* bonded to the third functional group C, and the plurality of fourth graphene quantum dots 15*d* bonded to the fourth functional group D. Therefore, the optical sensing layers 22*a*, 22*b*, 22*c*, and 22*d* in the optical sensing layer 130 are identical to one another and may be sensitive to all of the blue light band, the green light band, the red light band, and the infrared ray band.

The image sensor 200 may further include a color filter layer 140 disposed between the second electrode 14 and the transparent protection layer 120. For example, the color filter layer 140 may include a first color filter 141 that transmits only light of the first wavelength band, a second color filter 142 that transmits only light of the second wavelength band, a third color filter 143 that transmits only light of the third wavelength band, and a fourth color filter 144 that transmits only light of the fourth wavelength band. For example, the first color filter 141 may transmit light of the red wavelength band, the second color filter 142 may transmit light of the green wavelength band, the third color filter 143 may transmit light of the blue wavelength band, and the fourth color filter 144 may transmit light of the near infrared ray wavelength band. Alternatively, the first color filter 141 may transmit cyan light, the second color filter 142 may transmit magenta light, the third color filter 143 may transmit yellow light, and the fourth color filter 144 may transmit a near infrared ray.

The first through fourth optical sensing layers 22*a*, 22*b*, 22*c*, and 22*d* may be disposed in correspondence to the first through fourth color filters 141, 142, 143, and 144, respectively. For example, the first optical sensing layer 22*a* may detect light transmitted through the first color filter 141, the second optical sensing layer 22*b* may detect light transmitted through the second color filter 142, the third optical sensing layer 22*c* may detect light transmitted through the third color filter 143, and the fourth optical sensing layer 22*d* may detect light transmitted through the fourth color filter 144.

The optical sensing layer 130 of the image sensor 100 shown in FIG. 9A may include the optical sensing layer 32 shown in FIG. 5, the optical sensing layer 32' shown in FIG. 7, or the optical sensing layer 40 shown in FIG. 8, instead of the optical sensing layer 12 shown in FIG. 1. Similarly, the optical sensing layer 130 of the image sensor 200 shown in FIG. 10 may include the optical sensing layer 32 shown in FIG. 5, the optical sensing layer 32' shown in FIG. 7, or the optical sensing layer 40 shown in FIG. 8, instead of the optical sensing layer 22 shown in FIG. 3.

FIG. 11 is a schematic cross-sectional view of the structure of one pixel of an image sensor according to some example embodiments. Referring to FIG. 11, the optical sensing layer 130 of an image sensor 300 may include first through third optical sensing layers 131, 132, and 133 for sensing light of the visible ray band and a fourth optical sensing layer 134 for sensing light of the infrared ray band. For example, the first through third optical sensing layers 131, 132, and 133 may include a typical semiconductor material, such as silicon, a compound semiconductor material, an organic semiconductor material, or a 2D semiconductor material having a bandgap and having a 2D crystal structure. The fourth optical sensing layer 134 may have the same structure as the optical sensing layer 32 shown in FIG. 5, for example. In other words, the fourth optical sensing layer 134 may include the semiconductor layer 33 disposed on the first electrode 11 and the graphene quantum dot layer 34 disposed on the semiconductor layer 33. The graphene quantum dots in the graphene quantum dot layer 34 may be configured to be sensitive to an infrared ray by being bonded to the fourth functional group D. For example, the graphene quantum dots bonded to the fourth functional group D may have a band gap below or equal to 1.38 eV.

The semiconductor layer 33 of the fourth optical sensing layer 134 may include a semiconductor material identical to the semiconductor material constituting the first through third optical sensing layers 131, 132, and 133. In this case, after the semiconductor material is deposited throughout the first through fourth optical sensing layer 131, 132, 133, and 134, the semiconductor material deposited on the fourth optical sensing layer 134 may be etched to a certain depth, and the graphene quantum dot layer 34 may be formed on the semiconductor material that remains after the fourth optical sensing layer 134 is etched.

Alternatively, only the first through third optical sensing layers 131, 132 and 133 may include a semiconductor material, and the fourth optical sensing layer 134 may be formed to have the same structure as the optical sensing layer 12 shown in FIG. 1, the optical sensing layer 22 shown in FIG. 3, the optical sensing layer 32' shown in FIG. 7, or the optical sensing layer 42 shown in FIG. 8. In this case, after the semiconductor material is deposited throughout the first through fourth optical sensing layer 131, 132, 133, and 134, the semiconductor material deposited on the fourth optical sensing layer 134 may be completely etched away, and the optical sensing layer 22 shown in FIG. 3, the optical sensing layer 32' shown in FIG. 7, or the optical sensing layer 42 shown in FIG. 8 may be formed on the optical sensing layer 134.

The above-described image sensors 100, 200, and 300 may exhibit high detection efficiencies with respect to light of the visible ray band and the infrared band by using graphene quantum dots combined with functional groups. For example, the light detection efficiency for light of the infrared ray band may be improved as compared to a case of using a silicon semiconductor. Furthermore, a dark current generated while light is not incident may be effectively suppressed. Therefore, the degree of freedom for arrangement and size selection of sub-pixels may be improved, and the range of products to which the image sensor 100, 200, 300 are applied may be widened. For example, the image sensors 100, 200, and 300 may naturally obtain clear images in a an environment with high luminance and may also obtain high quality images by using near infrared rays together with visible rays even in a low-light environment with low luminance.

Furthermore, the image sensors 100, 200, and 300 may be applied to a case of sensing an iris image of a person. Since it is difficult to distinguish an iris from a sclera in a long wavelength band (far infrared ray band), it is difficult to recognize an iris by using a photodetector for a long wavelength band. On the contrary, in a short wavelength band (visible ray band), light is reflected by an area around an iris, and thus an iris pattern recognition error may occur. For example, in case of a dark brown or brown-based pupil, an iris may be recognized by using a near-infrared ray, but it may be difficult to recognize the iris by using a visible ray. On the other hand, in case of a blue or green pupil, an iris may be recognized by using a near-infrared ray and may also be recognized by using a visible ray. Therefore, an iris may be recognized by using a near infrared ray that may be applied to most of pupils. Therefore, in some example embodiments, the image sensor 100, 200, 300 exhibit high detection efficiencies with respect to light of the near-infrared band may be appropriate for imaging an iris.

Furthermore, due to the sensitivity (reactivity) and the quantum efficiency of the image sensor 100, 200, 300 with respect to infrared rays are high, the size of the optical sensing layer 130 may be reduced. Therefore, the image sensor 100, 200, 300 may be employed in a slim and compact electronic device, such as a smart phone. When the image sensors 100, 200, and 300 are employed in a smart phone, iris recognition rate may be increased and iris recognition accuracy may be improved. Therefore, the image sensors 100, 200, and/or 300 may be used for authenticating a user through iris authentication. Example embodiments are not limited thereto. The image sensors 100, 200, and/or 300 may be used in a low-light sensitivity enhancing device, a night vision sensor, a solar cell, and/or an autonomous navigation sensor.

It should be understood that example embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An optical sensor comprising:
a first electrode;
a graphene quantum dot layer,
the graphene quantum dot layer including a plurality of first graphene quantum dots bonded to a first functional group and a plurality of second graphene quantum dots bonded to a second functional group that is different from the first functional group; and
a second electrode on the graphene quantum dot layer.

2. The optical sensor of claim 1, wherein the first functional group is bonded to one or more carbon atoms at an outermost portion of the plurality of first graphene quantum dots, and
the second functional group is bonded to one or more carbon atoms at an outermost portion of the plurality of second graphene quantum dots.

3. The optical sensor of claim 1, wherein
the plurality of first graphene quantum dots are configured to absorb light of a first wavelength band, and
the plurality of second graphene quantum dots are configured to absorb light of a second wavelength band that is different from the first wavelength band.

4. The optical sensor of claim 3, wherein
the graphene quantum dot layer further includes a plurality of third graphene quantum dots bonded to a third functional group that is different from the first functional group and the second functional group, and
the third graphene quantum dots are configured to absorb light of a third wavelength band that is different from the first wavelength band and the second wavelength band.

5. The optical sensor of claim 1, wherein each of the first functional group and the second functional group independently include at least one of —$NO_2$, —$NH_2$, —$CH_3$, —OH, —COOH, =O, —CHO, —$COCH_3$, —(C=O)—, —F, —H, —CO—$N(CH_3)_2$, —$CH_2$—OH, —CO—$NH_2$, —$N(CH_3)_2$, alkylamine, aniline, or polyethylene glycol (PEG).

6. The optical sensor of claim 1, wherein
the plurality of first graphene quantum dots have a first size, and
the plurality of second graphene quantum dots have a second size that is different from the first size.

7. The optical sensor of claim 1, wherein a thickness of the graphene quantum dot layer ranges from about 50 nm to about 100 μm.

8. The optical sensor of claim 1, further comprising:
a semiconductor layer between the first electrode and the graphene quantum dot layer.

9. The optical sensor of claim 8, wherein the semiconductor layer includes at least one of silicon, a compound semiconductor material, an organic semiconductor material, and a 2-dimensional (2D) semiconductor material having a band gap and a 2D crystal structure, and
the semiconductor material forms a Schottky barrier between the semiconductor layer and the first electrode.

10. The optical sensor of claim 9, wherein an energy difference between a lowest unoccupied molecular orbital (LUMO) energy level of the graphene quantum dot layer and a valence band of the semiconductor layer is smaller than an energy difference between a work function of the first electrode and a conduction band of the semiconductor layer.

11. The optical sensor of claim 9, wherein the 2D semiconductor material includes a transition metal dichalcogenide.

12. The optical sensor of claim 11, wherein
the transition metal dichalcogenide includes a transition metal and a chalcogen element,
the transition metal includes at least one of tin (Sn), niobium (Nb), tantalum (Ta), molybdenum (Mo), tungsten (W), hafnium (Hf), titanium (Ti), or rhenium (Re), and
the chalcogen element includes at least one of sulfur (S), selenium (Se), or tellurium (Te).

13. The optical sensor of claim 8, wherein
the semiconductor layer includes a first semiconductor layer on the first electrode and a second semiconductor layer on the first semiconductor layer,
the first semiconductor layer is doped to have a first conductivity type, and
the second semiconductor layer is doped to have a second conductivity type that is electrically opposite the first conductivity type.

14. The optical sensor of claim 1, wherein the second electrode is a transparent electrode.

15. The optical sensor of claim 1, further comprising:
an optical sensing layer on the first electrode, wherein
the optical sensing layer includes the graphene quantum dot layer.

16. An optical sensor comprising:
a first electrode;
a semiconductor layer on the first electrode, a material of the semiconductor layer forming a Schottky barrier between the semiconductor layer and the first electrode;
a graphene quantum dot layer on the semiconductor layer,
the graphene quantum dot layer including a plurality of first graphene quantum dots bonded to a first functional group; and
a second electrode on the graphene quantum dot layer, wherein
the graphene quantum dot layer further includes a plurality of second graphene quantum dots bonded to a second functional group different from the first functional group, the plurality of first graphene quantum dots are configured to absorb light of a first wavelength band, and the plurality of second graphene quantum dots are configured to absorb light of a second wavelength band different from the first wavelength band.

17. The optical sensor of claim 16, wherein an energy difference between a lowest unoccupied molecular orbital (LUMO) energy level of the graphene quantum dot layer and a valence band of the semiconductor layer is smaller than an energy difference between a work function of the first electrode and a conduction band of the semiconductor layer.

18. The optical sensor of claim 16, wherein the plurality of first graphene quantum dots have a first size, and the plurality of second graphene quantum dots have a second size that is different from the first size.

19. The optical sensor of claim 16, wherein the semiconductor layer includes at least one of silicon, a compound semiconductor material, an organic semiconductor material, and a 2D semiconductor material having a band gap and a 2D crystal structure.

* * * * *